US006762467B2

United States Patent
Jong et al.

(10) Patent No.: US 6,762,467 B2
(45) Date of Patent: Jul. 13, 2004

(54) NONVOLATILE MEMORY CELL FOR PREVENTION OF SECOND BIT EFFECT

(75) Inventors: Fuh-Cheng Jong, Tainan (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/412,592

(22) Filed: Apr. 14, 2003

(65) Prior Publication Data

US 2003/0193062 A1 Oct. 16, 2003

(30) Foreign Application Priority Data

Apr. 16, 2002 (TW) .......................................... 91107797 A

(51) Int. Cl.$^7$ .......................................... H01L 29/792
(52) U.S. Cl. ...................................... 257/401; 257/410
(58) Field of Search ................................. 257/401, 410

(56) References Cited

U.S. PATENT DOCUMENTS

| | | | | |
|---|---|---|---|---|
| 5,644,155 A | * | 7/1997 | Lien | 257/401 |
| 5,777,361 A | * | 7/1998 | Parris et al. | 257/322 |
| 6,011,725 A | * | 1/2000 | Eitan | 365/185.33 |
| 6,037,631 A | * | 3/2000 | Deboy et al. | 257/339 |

* cited by examiner

Primary Examiner—Allan R. Wilson
(74) Attorney, Agent, or Firm—Rabin & Berdo, P.C.

(57) ABSTRACT

A nonvolatile memory cell for prevention from second bit effect comprises a pair of source/drain regions arranged with a channel therebetween, a programmable layer above the channel, and a gate conductor above the programmable layer. The memory cell is characterized in that the programmable layer has a maximum width substantially larger than the boundary widths between the programmable layer and the source/drain regions. The programmable layer comprises a trapping dielectric layer inserted between two insulator layers, and the trapping dielectric preferably comprises a nitride or an oxide having buried polysilicon islands.

8 Claims, 2 Drawing Sheets

# NONVOLATILE MEMORY CELL FOR PREVENTION OF SECOND BIT EFFECT

FIELD OF THE INVENTION

The present invention relates generally to a semiconductor memory, and more specifically to a nonvolatile memory cell for prevention form second bit effect.

BACKGROUND OF THE INVENTION

Among semiconductor memories, the nonvolatile memory, especially the electrically erasable programmable read only memory (EEPROM), is particularly useful due to its advantage of retaining information even power is turned off, and its application also becomes more popular. Similar to other semiconductor memories, the nonvolatile memory is developed toward scale down to increase the memory capacity. New and improved memory cell structures and better programming mechanisms are proposed to improve the performance of nonvolatile memory. For example, a perpendicularly accelerated channel injection CMOS (PACMOS) is disclosed by M. Kamiya, Y. Kojima, Y. Kato, K. Tanada and Y. Hayashi, "EPROM cell with high gate injection efficiency", IEDM Tech. Dig., 1982, pp 741–744, with a structure to enhance the channel injection to increase the injection efficiency. On the other hand, to increase the density of memory circuit and lengthen the electrical charge retention time, an oxide-nitride-oxide (ONO) structure has been used to replace conventional stack memory cell, which has the benefit of easy process and high density, for example, referring to T. Y. Chan, K. K. Young and Chenming Hu, "A true single-transistor oxide-nitride-oxide EEPROM device", IEEE Electron Device Lett., vol. EDL-8, pp 93–95, 1987 and U.S. Pat. No. 5,168,334 issued to Mitchell et al. By storing two bits in a single memory cell the memory capacity can be doubled, for example, referring to U.S. Pat. Nos. 5,768,192, 5,963,465 and 6,011,725 issued to Eitan. However, new problems are introduced. Two bits stored in a single memory cell may cause interactions between each other of them, especially for the electric field from the stored charge of one bit to influence the other bit when the latter is manipulated. Or when one bit is manipulated, the voltage applied has effect on the other bit. One of the known undesired situation is called second bit effect, by which the threshold voltage of second bit is lowered due to the source side injection occurred in the transistor when writing the second bit and the electron packet of the first bit spreads to result in over writing. The adverse effect has a more serious impact on the shrunk devices. Therefore, it is desired a nonvolatile memory cell for prevention from second bit effect.

SUMMARY OF THE INVENTION

One object of the present invention is to provide a nonvolatile memory cell to inhibit the second bit effect when writing data into the memory cell.

Another object of the present invention is to provide a double bit nonvolatile memory cell to double the memory capacity in single memory cell.

Still another object of the present invention is to provide a highly integratable nonvolatile memory cell to produce high density semiconductor memory.

Yet another object of the present invention is to provide a nonvolatile memory cell with ONO programmable layer to obtain the benefit of easy process and high density as for stack memory cell.

According to the present invention, a nonvolatile memory cell for prevention from second bit effect comprises a channel on a semiconductor substrate and a pair of source/drain regions at opposite sides of the channel. Above the channel is arranged a programmable layer and a gate conductor over the programmable layer. The programmable layer has a first and second boundary between the programmable layer and the source and drain regions, respectively, and a maximum width larger than the widths of the first and second boundary to inhibit the second bit effect occurred within the nonvolatile memory cell.

The programmable layer comprises a trapping dielectric layer inserted between two insulator layers. The trapping dielectric comprises a nitride or an oxide with buried poly-silicon islands, such that the regions at each side of the trapping dielectric layer close to the source and drain regions may provide for storing a bit, respectively.

In a preferred embodiment, the memory cell according to the present invention has a hexagonal gate.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
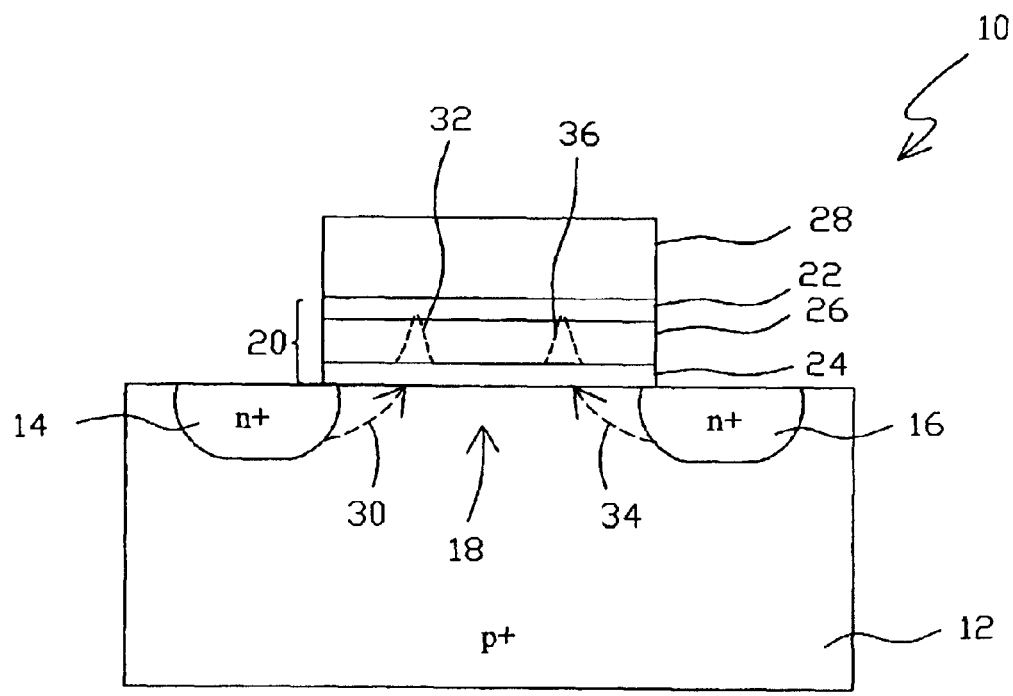
FIG. 1 is the cross-sectional view of a flash memory cell with an ONO programmable layer, in which the second bit effect is also shown.

FIG. 1 shows the cross-sectional view of an NMOS type flash memory cell 10, which is formed on a p+ substrate 12 with an heavily doped n+ source region 14 and drain region 16 with a channel region 18 therebetween and a programmable layer 20 above the channel region 18. In this embodiment, the programmable layer 20 has an ONO structure that includes an upper and lower oxides 22 and 24 with a nitride 26 inserted therebetween, by which the nitride 26 serves as a trapping dielectric layer where charge can be injected in and retained of at either one of its opposite sides. As is well known, other materials, such as oxide having buried poly-silicon islands, can also be used as the trapping dielectric layer. Above the programmable layer 20 is the gate conductor 28 formed of poly-silicon.

FIG. 1 also illustrates the second bit effect. As shown, the memory cell 10 can store two bits, and under appropriate bias conditions the regions in the trapping dielectric layer 26 adjacent to the source/drain regions 14 and 16 can be written in one bit data, respectively, by hot electron injections 30 and 34 to form electron packets 32 and 36 within the nitride 26, thereby doubling the capacity of the memory cell 10. However, it is obviously that undesired situation may occur when manipulating two different bits in this structure for the reason that the bit under manipulation may be effectively influenced by the voltage applied to the transistor and the existence of the other bit. In particular, during writing data into a second bit the source side injection is likely to occur in the cell transistor 10, as indicated by arrow 30 in FIG. 1, resulting in threshold voltage lowering of the second bit and electron packet spreading of the first bit and over writing consequently.

Figure 2:
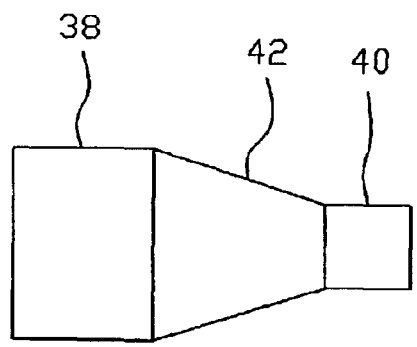
FIG. 2 is the top view of a MOS transistor with a gate of a funnel shape, in which the drain is wider than the source.
Figure 3:
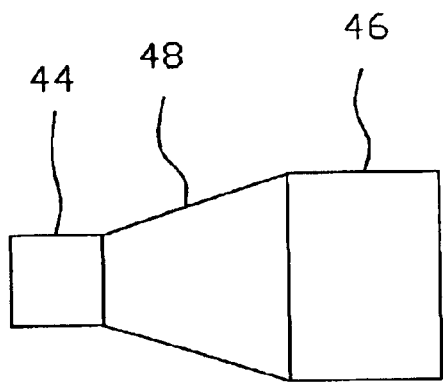
FIG. 3 is the top view of a MOS transistor with a gate of a funnel shape, in which the source is wider than the drain.

The aforementioned second bit effect is resulted from the source side injection, and thus modifying the cell transistor structure may influence the performance of the transistor. The characteristic of substrate current is widely used as a tool to observe hot carrier effect. To understand the principle of the present invention, a known concept is introduced herewith. FIGS. 2 and 3 illustrate two MOS devices with gates of a funnel shape. In the transistor of FIG. 2, its drain region 38 is wider than the source region 40 and the gate 42 is of a funnel shape that is getting gradually narrower from the drain region 38 to the source region 40, by which the device is observed to have a phenomenon of source injection. Contrarily, in the transistor of FIG. 3 the source region 46 is wider than the drain region 44 and its gate 48 is also of a funnel shape, however, that is getting gradually narrower from the source region 46 to the drain region 44, in which the device does not have the source injection. For details on the double peak substrate current of such transistors with gate of a funnel shape, reader is referred to T. Y. Huang and J. Y. Chen, "Observation of double-hump substrate current in funnel-shape transistors", IEEE Electron Device Lett., vol. EDL-6, pp 510–512, 1985.

Figure 4:
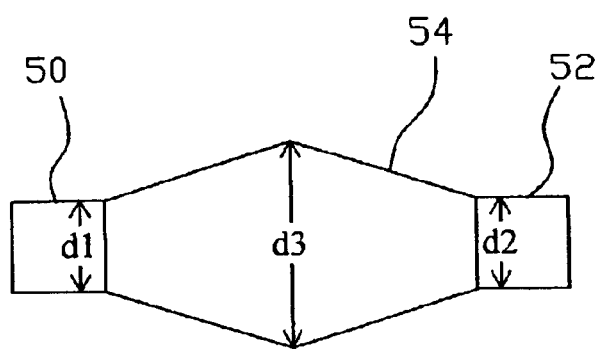
FIG. 4 is the top view of a flash memory cell with a hexagonal gate whose waist is wider than the widths of the source and drain regions.

Based on the aforementioned principle, further improvement is proposed, and FIG. 4 is a preferred embodiment according to the present invention, in which the transistor comprises a pair of mirrored symmetric source/drain regions 50 and 52. As is well known, the roles of source and drain in a MOS device may be interchanged with each other under different applied voltages, therefore, in a first transistor, the region 50 is the drain and the region 52 is the source, while in a second transistor, the region 50 is the source and the region 52 is the drain. Between the source/drain regions 50 and 52 is gate 54, which has boundaries adjacent to the region 50 and 52 with widths of d1 and d2, respectively, and the waist of its own has a width of d3, such that it is symmetrical with respect to the waist as the central axis and the whole gate 54 appears hexagonal. The waist width d3 of the gate 54 is larger than the boundary widths d1 and d2 of the source/drain 50 and 52. The cross-sectional view of the transistor is the same as that shown in FIG. 1. Applying the transistor of FIG. 4 in the double bit flash memory cell can inhibit the second bit effect, thereby improving the performance of the cell. In other embodiments, the shape of gate and source/drain regions in a memory cell may be modified or asymmetrical, only that the maximum width of the gate remains larger than the boundary widths between the gate and the source/drain regions.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A nonvolatile memory cell for prevention from of second bit effect, comprising:
    a channel on a semiconductor substrate;
    a pair of source and drain regions arranged with the channel therebetween;
    a programmable layer above the channel; and
    a gate conductor above the programmable layer;
    wherein the programmable layer has a maximum width at a location between the source and drain regions which is substantially larger than a first and second boundary widths of the programmable layer immediately adjacent to the source and drain regions, respectively, and
    wherein the widths of the programmable layer are measured in a direction orthogonal to a direction along the channel between the source and drain regions.

2. A memory cell according to claim 1, wherein the programmable layer comprises a trapping dielectric layer inserted between two insulator layers.

3. A memory cell according to claim 2, wherein the trapping dielectric comprises a nitride and the insulator comprises an oxide.

4. A memory cell according to claim 2, wherein the trapping dielectric comprises a first oxide having buried poly-silicon islands and the insulator comprises a second oxide.

5. A memory cell according to claim 1, wherein the first and second boundary widths are substantially equal.

6. A memory cell according to claim 1, wherein the gate conductor is symmetrical with respect to a line which is at the position of the maximum width of the gate conductor mid orthogonal to the direction along the channel.

7. A memory cell according to claim 6, wherein the gate conductor has a hexagonal layout.

8. A memory cell according to claim 1, wherein the gate conductor is asymmetrical with respect to a central line which is at the position of the maximum width of the gate conductor and orthogonal to the direction along the channel.

* * * * *